United States Patent [19]

Dunn et al.

[11] 3,793,474

[45] Feb. 19, 1974

[54] LEAD CONFIGURATIONS FOR PLASTIC ENCAPSULATED SEMICONDUCTOR DEVICES

[75] Inventors: Thomas A. Dunn; Glenn E. Kirk, both of Mesa, Ariz.

[73] Assignee: Motorola, Inc., Franklin Park, Ill.

[22] Filed: Dec. 9, 1971

[21] Appl. No.: 206,388

[52] U.S. Cl. .................. 174/52 PE, 29/589, 29/590, 174/DIG. 3, 317/234 E, 317/234 N

[51] Int. Cl. .............................................. H05k 5/00

[58] Field of Search ........... 174/523, 52 PE, DIG. 3; 317/101 CC, 101 CP, 101 F, 234 N, 234 E, 234 G; 29/588–590, 626, 627, 193, 193.5

[56] References Cited

UNITED STATES PATENTS

| | | | |
|---|---|---|---|
| 3,480,836 | 11/1969 | Aronstein | 174/52 PE UX |
| 3,519,890 | 7/1970 | Ashby | 317/234 N UX |
| 3,627,901 | 12/1971 | Happ | 174/DIG. 3 X |

*Primary Examiner*—Darrell L. Clay

[57] ABSTRACT

The disclosed lead configurations protect fragile bonds associated with connecting wires extending between the ends of leads and bonding pads on a semiconductor chip, which are all included in an encapsulated body, from the harmful stresses caused by thermally and mechanically generated forces. The encapsulated portions of each lead includes a transverse segment which is generally perpendicular to the axis of expansion and an integral longitudinal segment which lies generally along the axis. These two segments form a shoulder which is located near the chip to reduce movement of the lead end away from its pad in response to thermal expansion. Moreover, each lead also includes a further segment having a smaller cross-sectional area than an associated protruding portion. This further segment and the shoulder forming segments absorb externally applied forces to protect the fragile bonds.

7 Claims, 9 Drawing Figures

PATENTED FEB 19 1974 3,793,474

SHEET 2 OF 2

LEAD CONFIGURATIONS FOR PLASTIC ENCAPSULATED SEMICONDUCTOR DEVICES

RELATED INVENTIONS

The invention of the present application is related to those in the following patents assigned to applicants' assignee; U.S. Pat. No. 3,367,025 issued Feb. 6, 1968; U.S. Pat. No. 3,444,440 issued May 13, 1969; U.S. Pat. No. 3,444,441 issued May 13, 1969; and U.S. Pat. No. 3,611,061 issued Oct. 5, 1971.

BACKGROUND OF THE INVENTION

The electronic industry is striving to provide rugged, low cost housings for electronic devices which take up minimum amounts of space and which can withstand adverse temperatures and mechanical stresses. Semiconductor technology enables either one or a plurality of active and passive electrical components to be fabricated on one fragile, minute silicon chip or die. Special internal structures and housings, are required in this art, to protect these chips from mechanical stresses and to hold lead structures which facilitate electrical connection of bias, input and output signals to the chip and mechanical connection of the housing to a mounting structure in using the device.

Plastic housings for semiconductor chips are of principal interest because of their lower cost as compared to other types of housings suitable for enclosing semiconductor components. The plastic encapsulating process used to fabricate these plastic housings lends itself to mechanization which facilitates economical mass production of semiconductor devices. A plastic encapsulated integrated circuit structure includes a plastic body which encloses at least one minute semiconductor chip mounted on a metal bonding area and each of a plurality of metal leads having internal portions individually encased by the plastic and external portions protruding from the plastic. Also enclosed by the body are fine interconnecting wires which have first ends wire bonded to the internal portions of each lead and second ends wire bonded to associated bonding pads or terminals on the surface of the integrated circuit chip to provide electrical connection therebetween. The chip is usually located at the center of the body.

Prior art plastic encapsulated integrated circuits are subject to failure at high temperatures. As the ambient temperature or as the temperature of the die increases, the temperature of the plastic body increases causing it to expand in all directions about its center so that its incremental volumes located farthest from the chip are moved the greatest distance relative to the chip. Moreover, as the temperature of the package decreases, it tends to contract thereby moving its incremental volumes located farthest from the center, the greatest relative distance toward the semiconductor chip. Since the coefficient of thermal expansion of the metal leads is different from the coefficient of thermal expansion of the plastic, the leads tend to expand and contract at a different rate than the housing. As a result, as the housing temperature increases leads having portions perpendicular to the direction of expansion and which are located farthest from the chip tend to be moved or "flared" by the plastic in which they are embedded the greatest distance from the chip. Accordingly, the internal ends of these leads float away from their associated bonding pads thereby subjecting the fine interconnecting wires to stresses which might either temporarily or permanently dislodge a connection between an interconnecting wire and either the lead or the pad to cause a permanent or intermittent break in electrical contact which destroys the usefulness of the device.

Furthermore, prior plastic encapsulated devices are subject to failure in response to mechanical stresses applied to the leads thereof. After the leads and semiconductor chip have been encapsulated in plastic, the leads are generally still attached to a lead frame and lie in a plane parallel to the plane of the semiconductor chip. Forces are applied to the leads by a cutting die to shear them from the frame, and the leads may then be bent to positions essentially perpendicular to the plane of the chip. Finally, other mechanical forces are applied to the housing and to the leads to insert the external portions of the leads into sockets or other receptacles. Hence, during these assembly operations, mechanical bending and twisting forces are necessarily applied to the external portions of each of the leads which tend to cause the internal ends of the leads to be displaced thereby subjecting the interconnecting wires and bonds to harmful stresses. Leads which are too rigid within the plastic body generally have the greatest tendency to transmit forces from their external to their internal portions which undesirably result in breakage of the fragile bonds between themselves and their associated interconnecting wires or the bonds between the interconnecting wires and the bonding pads.

SUMMARY OF THE INVENTION

One object of this invention is to provide an improved plastic encapsulated semiconductor device with lead portions securely anchored in the plastic encapsulation to withstand physical and thermal stresses without breaking the electrical connections between the leads and the semiconductor unit in the plastic.

Another object is to provide a semiconductor device with a metal lead having an improved configuration which is suitable for being embedded in an encapsulating material having a different thermal coefficient from the material of the lead.

Still another object is to provide a semiconductor device with a plurality of leads each having an improved configuration which has an internal portion embedded within an encapsulating plastic body and an external portion located outside of the body, which configuration in the plastic body reduces the magnitude of mechanical forces transmitted from the external portion of the lead to its internal portion.

A further object is to provide an improved configuration for the embedded portion of a lead in a semiconductor device, the internal portion of the lead is connected to a semiconductor die with a fragile electrical connection with both enclosed by an encapsulating material which has a coefficient of thermal expansion different from the material of the lead, and which configuration reduces movement of the lead in the material so as to protect the electrical connection as the encapsulating material expands or contracts in response to changes in its temperature.

A still further object is to provide an improved configuration for a lead in a semiconductor device having a first part with an inner portion connected through a fragile electrical connection to a semiconductor die in a plastic encapsulating body, with a second part external to the body, and with the lead configuration being such as to reduce the transmission of mechanical forces from the second part of the lead to the first part of the lead and thereby protect the fragile electrical connection.

An additional object is to provide an improved metal lead frame with a plurality of leads adapted to be connected with semiconductor means mounted on the lead frame, with each such lead having a configuration such that when embedded in a plastic housing in an assembled semiconductor device will minimize movement of the lead in the housing.

In brief, the invention generally relates to an improved electrical lead configuration for a semiconductor device having an internal portion enclosed by encapsulating material which also encloses a semiconductor chip, and an external part for the electrical lead which protrudes from the material. The configuration protects a fragile connection between the chip and the lead against breakage from thermally and mechanically generated stresses. More particularly, the improvement relates to the configuration of the internal portion of the one-piece lead ad provides a first portion located near the chip which extends substantially perpendicular to an axis or direction of expansion of the encapsulating material. A second portion of the one-piece lead extends substantially parallel to the axis or direction of expansion of the encapsulating material. With this configuration, the first and second portions define a shoulder which locks into the encapsulating material near the chip to minimize movement of the internal part of the lead away from the chip even though the encapsulating material expands at a different rate from the lead. Furthermore, the lead configuration includes a third portion of the one-piece lead located between the external and internal portions having a reduced cross-sectional area with respect to the external portion so that the third portion impedes transmission of torsional, tensile and compressive forces from the external portion to the internal portion of the lead. The combination of the first, second and third lead portions can be arranged to form joints which absorb and thereby reduce the magnitude of tensional and compressive forces transmitted from the external portion to thereby tend to prevent them from destroying the fragile connection at the lead end portion and at the chip connected thereto.

Furthermore, the invention is also embodied in a multiple device lead frame member which lends itself as a vehicle for high speed device assembly fabrication.

DETAILED DESCRIPTION

Figures 1, 2, 3, 9:
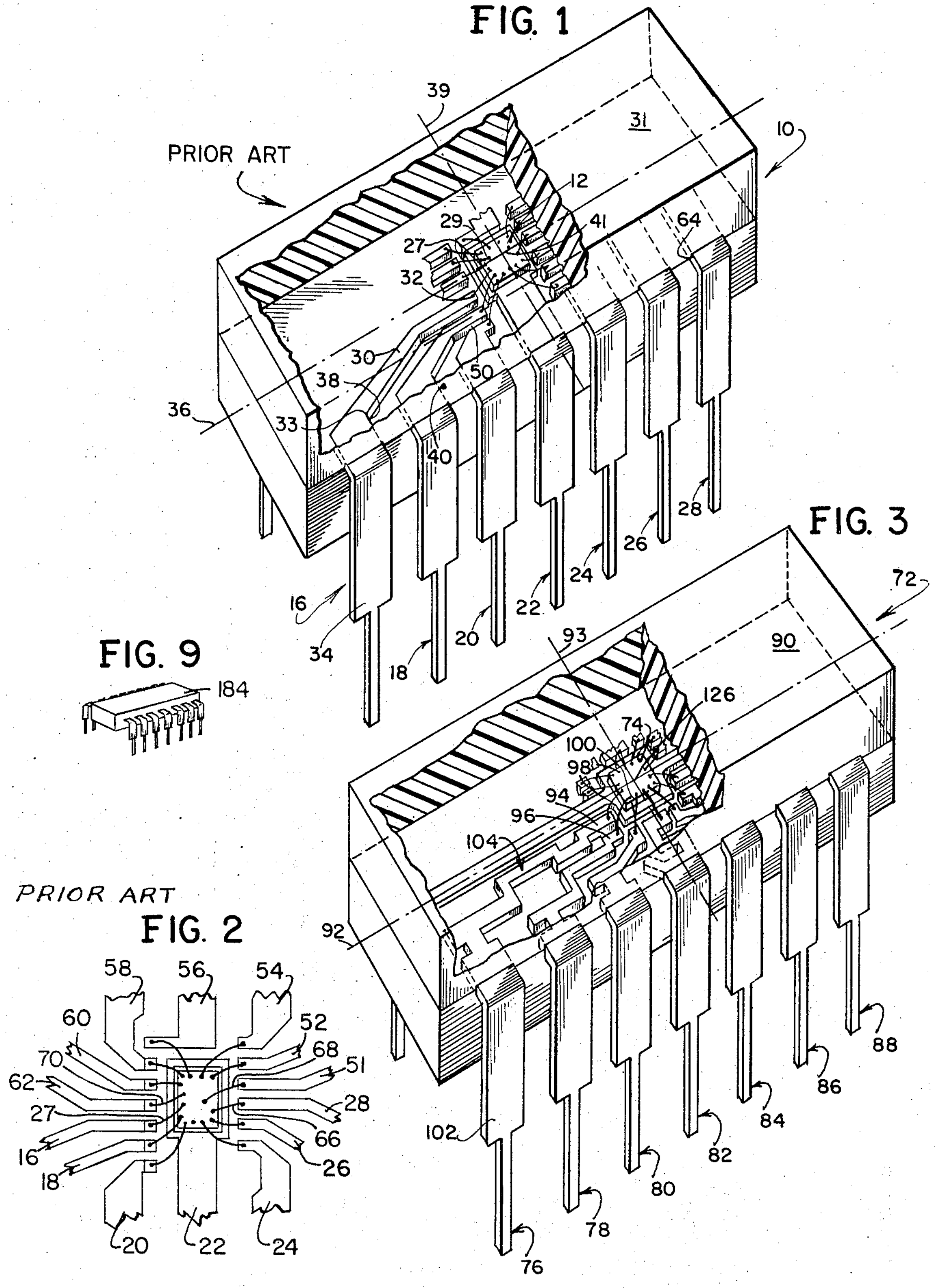
FIG. 1 is an enlarged isometric view of a prior art dual-in-line integrated circuit package showing a portion of the plastic material broken away to reveal the configurations of one example of prior art leads.
FIG. 2 is an enlarged fragmentary plan view of the die mounting portion of the device of FIG. 1.
FIG. 3 is an enlarged isometric view of a dual-in-line integrated circuit package showing a portion of the encapsulating material broken away to reveal the configurations of leads formed in accordance with the present invention.
FIG. 9 is a perspective view showing the actual size of the completed semiconductor device assembled on the frame member segment of FIG. 5.

FIG. 1 shows an enlarged view of a prior art dual-in-line plastic encapsulated semiconductor device 10 which includes an integrated circuit chip or die 12 formed from a minute fragile piece of silicon by processes known in the integrated circuit technology. Device 10 will be described to illustrate the problems of prior art devices which are reduced by the present invention. The main purpose of the plastic housing for the device 10 is to protect chip 12, which may include a plurality of active and passive electrical components, having contacts thereon from ambient conditions and physical stresses, and to support lead structures, e.g., leads 16, 18, 20, 22, 24 26 and 28 and their counterpart leads on the opposite side of the dual-in-line structure which are not shown. The leads are connected through very fine wires such as 27 to contacts such as 29 formed on the surface of chip 12. The connection to the contacts can also be made through spider leads utilized in spider bonding or through leads facilitating flip-chip interconnections. Such leads each have internal portions which are embedded in the plastic body and external portions which protrude from such body 31 for providing electrical and mechanical connections.

More specifically, lead 16 for instance, has an internal portion 30 having a first or interior end 32 physically located near chip 12 and an external portion 34 which is integral with internal portion 30 and which extends from the body 31. Shoulder 33 is formed in the internal portion 30 to facilitate protrusion of the external portion 34 at right angles to the longitudinal axis 36 of the device. The fine interconnecting wire 27 has one end bonded to the metallized pad 29 and the other end bonded to end 32 of lead 16. These connections or bonds are rather fragile and subject to being broken by tensile or twisting forces transmitted thereto from the lead, and these forces may be created by thermal or mechanical phenomena which will subsequently be described. The internal portions of the leads, the intermediate bonding or connecting wires and the silicon die are completely enclosed or encapsulated in a plastic material forming a rectangular body 31 which, in the case of a 14 lead dual-in-line housing, has standard dimensions requiring a length of about 0.750 inch, a width of about 0.280 inch, and a thickness of about 0.200 inch.

A portion of this plastic material has been removed from body 31 of FIG. 1 to illustrate the configuration of prior art leads 16, 18, 20 and 22, of the lower left-hand quadrant of the device as defined by axes of symmetry 36 and 39. The leads of the other three quadrants have corresponding configurations.

The plastic encapsulating materials of the thermosetting types, which include compounds such as phenolic, epoxy, and silicones commonly used to encapsulate semiconductor chips, generally have thermal coefficients of expansion within the range $25 \times 10^{-6}$ inch per inch/°C up to $300 \times 10^{-6}$ inch per inch/°C. On the other hand, the metal leads, such as lead 16, which may be made from nickel, generally have thermal coefficients of expansion on the order of $13.3 \times 10^{-6}$ inch per inch/°C. Therefore, it can be seen that the temperature coefficients of the leads and the encapsulating material are unequal; and, since the encapsulating material has a much greater thermal expansion coefficient, it will expand more for a given increase in temperature change than the lead material.

Most bodies composed of a homogeneous material when heated tend to expand about their geometric centers. Because of the cumulative effect of this expansion, incremental volumes of the housing 31 located the farthest from the geometric center of the heated body tend to be moved farther from the center than the incremental volumes of the housing 31 located closer to the center. Therefore, as the temperature of plastic encapsulating body 31 is increased either by heat generated in chip 12 or because of an increase in the temperature of its ambient medium, an incremental volume located at point 38 of body 31 which abuts shoulder 33 tends to be displaced farther from chip 12, which is located at geometric center 41 of the body, than an incremental volume located e.g., at point 40.

As represented by their respective temperature coefficients, lead 16 does not expand as much as body 31 for a given increase in temperature. Hence, as the temperature of body 31 increases the incremental volumes, abutting against shoulders extending perpendicular to the direction of expansion tend to sweep or float the leads away from chip 12. As a result, for instance, end 32 of internal lead portion 30 tends to be moved away from bonding pad 29 thereby applying shear, torsional and tensile stresses to interconnecting wire 27. Accordingly, if the temperature increases a sufficient amount, end 32 of lead 16 will move a sufficient distance away from bonding pad 29 to break one of the bonds at one of the ends of wire 27 and thereby cause a failure of the circuit included on chip 12. If when the temperature of the body is reduced the lead are moved close enough to the bonding pad to restore connection, the failure is of an intermittent nature. However, if the connection is not restored when the temperature is decreased, the failure is of a permanent nature.

Longitudinal axis 36 extends in the direction of the greatest amount of expansion of body 31 with temperature increase and is defined as an axis of expansion. Cross-sectional planes of body 31 which are perpendicular to axis 36 tend to move away from geometric center 41 of body 31 in proportion to their distances from geometric center 41 and thereby tend to move the lead, i.e., 16 having a protruding portion located farthest from the geometric center the greatest distance along axis 36. Therefore, the respective distances which leads 16, 18 and 20 and their respective counterparts are moved away from the center of body 31 along axis 36 by a given expansion along axis 36 are progressively greater.

Similarly, transverse axis 39 indicates an axis of expansion in directions perpendicular to longitudinal axis 36. Cross-sectional planes of material perpendicular to axis 39 tend to move along axis 39 away from geometric center 41 of body 31 in proportion to their distances from the geometric center as the temperature of body 31 increases. Thus, expansion of body 31 along axis 39 tends to move lead 20 and its three counterparts the farthest distance along axis 39 from the center because lead 20 presents a surface 50 which is farthest from the center and is perpendicular to the axis of expansion. Accordingly, the respective distances which leads 20, 18 and 16 are moved away from the center of body 31 along axis 39 by a given expansion along axis 39 are progressively greater. As each lead of device 10 is moved by thermal expansion of the encapsulating material its tendency to break the bonds on the associated interconnecting wire is proportional to the distance it is moved. Since body 31 is longer than it is wide, its expansion in the transverse direction is not as great as its expansion in the longitudinal direction.

FIG. 2 shows an enlarged fragmentary plan view of the die mounting portion of device 10 of FIG. 1. The view shows the end portions of leads 16, 18, 20, 22, 24, 26 and 28 which have previously been referred to. Also shown are the end portions of leads 51, 52, 54, 56, 58, 60 and 62. Since lead 16 as previously described and its counterparts, i.e., leads 28, 51 and 62 present surfaces, e.g., 33 and 64, of FIG. 1, which lie in planes perpendicular to the axis of expansion 36 and which are located the farthest from the center of body 31, these four leads are most likely to break bonds on respective interconnecting wires 27, 66, 68 and 70 in response to thermal expansion. Leads 18, 26, 52 and 60 form the group which are next most likely to break the bonds on their associated interconnecting wires in response to thermal expansion.

DESCRIPTION OF THE PRESENT INVENTION

FIG. 3 shows another enlarged view of a dual-in-line plastic device 72 which includes an integrated circuit chip or die 74 and which protects die 74 from physical stresses while providing a convenient structure for holding leads 76 through 88 and their counterparts. Body 90 of device 72 has the same standard dimensions as body 31. A portion of plastic body 90 which encapsulates the leads, die and interconnecting wires is broken away in FIG. 3 to reveal leads having configurations which have been improved according to the present invention which lie in the lower left-hand quadrant defined by the intersection of longitudinal axis 92 and transverse axis 93. The configurations of leads 76 and 78, which correspond to prior art leads 16 and 18 of FIG. 1, have been modified to attenuate movement of their internal end portions 94 and 96 to thereby protect the bonds at either end of respective interconnecting wires 98 and 100, as also shown in FIG. 4.

More specifically, lead 76 may be considered as having an external portion 102 which extends from plastic body 90 and an internal portion 104 which is comprised of the connection of several integral subportions. Referring now to FIG. 4 which shows an enlarged plan view of leads 76, 78, 80 and 82, it can be seen that end portion 94 of lead 76 lies in a direction which is parallel to longitudinal axis of expansion 92. First transverse portion 106 of lead 76 has a first end integrally joined with end portion 96 and lies in a direction which is substantially perpendicular to longitudinal axis 92. The second end of first transverse portion 106 is integrally connected to a first end of a first longitudinal portion 108 which has its second end connected to a first end of second transverse portion 110. A second longitudinal lead portion 112 has a first end connected to the second end of second transverse portion 110 and a second end connected to a first end of third transverse portion 114. Third longitudinal portion 116 has a first end integral with the second end of third transverse portion 114. Connecting portion 118 has a first sub-part 120 which is integral with third longitudinal portion 116 and a second sub-part 122 which has a larger cross-sectional area than sub-part 120 and extends from the end of sub-part 120 to form an integral part with external lead portion 102.

First transverse portion 106 of lead 76 and first longitudinal portion 108 form a first plastic locking shoulder 124 which is in a plane perpendicular to longitudinal axis of expansion 92. Shoulder 124 may be located at a longitudinal distance A on the order of one-tenth of an inch from geometric center 126 of body 90, whereas shoulder 128 may be located a longitudinal distance B on the order of three-tenths of an inch from center 126. Accordingly, the plastic material abutting up against shoulder 124 tends to move a relatively small distance from the center 126 as compared to the material abutting against shoulder 128 for a given expansion of body 90 in a direction along longitudinal axis 92. Therefore, shoulder 124 tends to lock end portion 94 into close proximity with die 74 thereby protecting the wire bonds at each end of fine connecting wire 98 which may have a diameter of 0.001 to 0.0015 inch. This technique may also be employed to protect spider and flip-chip bonds. Similarly, second plastic locking shoulder 129 formed by first longitudinal lead portion 108 and second transverse portion 110, and third plastic locking shoulder 130 formed by second longitudinal portion 112 and third transverse portion 114 also tend to hold internal end portion 94 of lead 76 in place so that it does not move as far in response to a given expansion of body 90 as corresponding end 92 of prior art lead 16 moves in response to a corresponding expansion of body 31 of FIG. 1.

Figures 4, 5, 6, 7, 8:
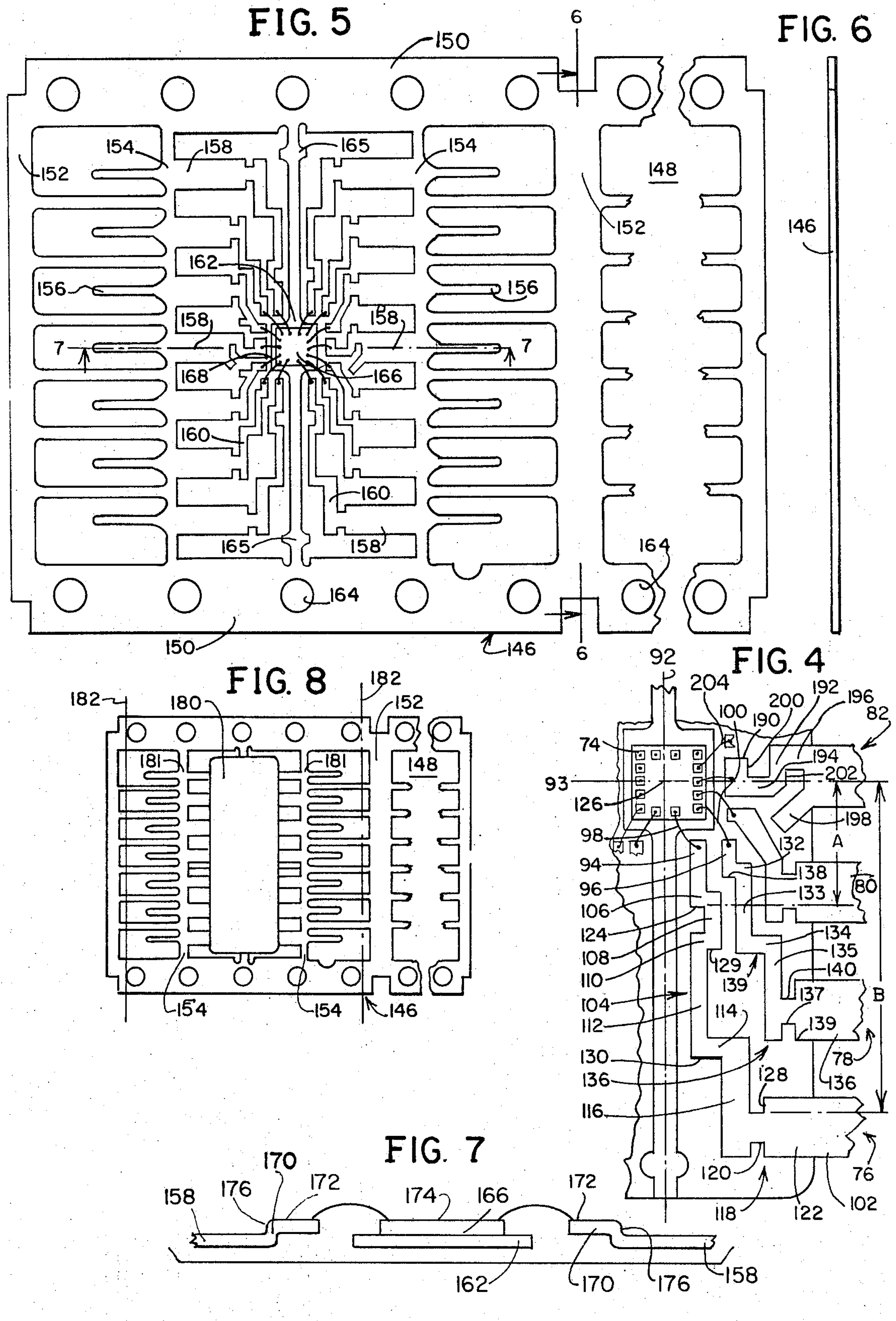
FIG. 4 is an enlarged plan view of part of the lead configuration of the device of FIG. 3.
FIG. 5 is an enlarged plan view of a lead frame member representing one segment or group of leads for the assembly of a semiconductor device in an elongated metallic strip including a plurality of corresponding segments or groups of leads in the complete step.
FIG. 6 is a sectional view of the lead frame member of FIG. 1.
FIG. 7 is a fragmentary sectional view of the die or chip and the die mounting portion of the member shown in FIG. 5 which illustrates leads having end portions formed to lie in the same plane as the top of the die.
FIG. 8 is an enlarged view of a semiconductor device and frame member after encapsulation, showing by dotted lines, portions of the metallic frame member removed in the final steps of the device fabrication.

As also shown in FIG. 4, lead 78 also includes a plurality of integrally connected lead portions. A first transverse portion 132 has one end affixed to internal end portion 96 and its other end affixed to a first end of first longitudinal portion 133. Second transverse portion 134 has one end affixed to a second end of first longitudinal portion 133 and a second end integral with second longitudinal portion 135. Connecting portion 136 includes a first sub-part 137 which is integrally joined to second longitudinal portion 135 and a second sub-part 139 which is integrally joined with external portion 136 of lead 78. First plastic locking shoulder 138 of lead 78, which is formed by the surfaces of first transverse portion 132 and first longitudinal portion 133, and second plastic locking shoulder 139 which is formed by the surfaces of second transverse portion 134 and second longitudinal portion 135, tend to lock lead 78 in place by cooperating with the material abutting them in a manner similar to that described in regard to lead 76.

The expanding encapsulating material abutting shoulder 128 of lead 76 and shoulder 140 of lead 78 tends to pull the leads farther from center point 126 than the plastic locks at shoulder 124 and 138 will let the leads move. Thus the portions of the leads intermediate these shoulders are subjected to and sustain thermally created stresses so that these stresses are not applied to the associated wire bonds. Leads 76 and 78 can be designed to easily withstand these stresses whereas the wire bonds cannot be readily designed to withstand them.

Therefore, the leads having an improved configuration as illustrated in FIGS. 3 and 4 tend to be relatively immovable in response to thermal expansion of the body in which they are located as compared to the leads of prior art devices as illusrated in FIG. 1. The plastic locking structures described with respect to leads 76 and 78 can be duplicated to provide similar configurations for counterpart leads.

Referring now to FIG. 5, an enlarged plan view of lead frame segments 146 is illustrated as part of an elongated metallic lead frame member or strip 148 which may be fabricated from a strip of nickel of a desired gauge by a series of metal stamping steps. FIG. 6 shows an end section view of segment 146 to illustrate the thinness of the segment. This segment at the left hand portion of FIG. 5, of course, is that portion on which a single integrated circuit device is fabricated. Metallic strip 148 could be formed from any material which has good electrical and heat conducting properties. Chemical etching and mechanical machining are also suitable for fabricating the strip 148 which can be advantageously employed in the manufacture of device 72 of FIG. 3.

Two parallel joining bands 150 extend the entire length of the lead frame strip 148 and define the longitudinal extremity of the semiconductor devices to be assembled. A plurality of parallel connecting portions 152, which are integral with joining bands 150 and perpendicular thereto, are evenly spaced along the length of member 148. These connecting portions are wide in cross-section and reinforce strip 148 to facilitate the handling of the many semiconductor devices which are being fabricated in the long strip at one time and are not individually separated from the step until after encapsulation.

A pair of lead spacers 154 are formed parallel to connecting portions 152 and are integral with joining bands 150. Although they have substantially smaller cross-sections than connecting portions 152, lead spacers 154 give additional reinforcement to strip 148 in its elongated strip form and confine the molding material during encapsulation. Extending outwardly from each lead spacer 154 toward the adjacent lead connecting portion 152 are the external parallel portions 156 of a plurality of leads. Each of the external portions are formed in their initial as well as final configuration in the stamping process to facilitate their insertion in sockets or receptacles. Extending inwardly from the lead spacers are internal lead portions 158. The internal lead portions include extensions 160 having previously described configurations projecting inwardly toward the mounting portion or area 162 which is centrally located in segment 146 and which is affixed to joining bands 150 by longitudinal arms 165.

An indexing array, in the form of openings 164 is provided in the original strip of metal for indexing the strip. These openings facilitate the stamping of metallic strip 148 and for use in assembly steps for the semiconductor devices.

In FIG. 5, a silicon chip 166 is shown to be physically attached to mounting area 162 and electrically connected through interconnecting wires 168 to internal lead portions 158. To mount chip 166 on area 162 and fabricate the complete device, metallic strip 148 is placed on a conveyor with projections that cooperate with indexing array 164. The conveyor is programmed to position the mounting portion 162 at a predetermined location in a die bonder. Chip 166 is carefully oriented so that the die bonder may grasp it and automatically attach it to mounting portion 162. Next, interconnecting wires 168 are bonded to the internal end portion of each lead thereby electrically connecting chip 166 to them.

The lead frame 148 of FIG. 5 facilitates the construction of devices having a plurality of leads with the same configuration as leads 76 through 88, as shown in FIG. 2. The leads of frame 146 of FIG. 5 includes shoulders located adjacent to the semiconductor chip 166 to impede the movement of the ends of these leads when encapsulated in a temperature responsive material, as previously described.

FIG. 7, which is a sectional view along line 7—7 of FIG. 5, shows an additional shoulder for the end portions of the leads located adjacent to chip 166. To facilitate thermal compression welding of the interconnecting wires, the tip of each internal end portion of the leads 158 is bent up so that their top surfaces lie in the same plane as the top surface 174 of the die 166. By placing all surfaces on which wire bonding is to be performed in the same plane, the time required for wire bonding is substantially reduced. Furthermore, the shoulders formed, such as 176, in each lead by this operation also provide an additional plastic lock which is very close to the center of the die. This plastic lock can further reduce movement of its associated lead in the presence of thermal expansion of the plastic material and it can also make the lead more secure so that it does not move as far as it otherwise would in response to tensile, compressive and rotational forces applied to its external portion. This latter advantage is particularly important for leads such as lead 82 of FIG. 4 which has a relatively small surface area surrounded by encapsulating material as compared to the other leads.

Metallic strip 148 with a plurality of groups of internal portions or segments 146 each corresponding to the leads for a completed device, partially assembled as described, is positioned in a transfer mold (not shown) in preparation for encapsulation of plastic. Indexing array 164 cooperating with a corresponding array on the face of the mold aligns the strip precisely in the mold. The upper end or mold faces closed on joining bands 150 and lead spacers 154 with sufficient force to deform them and seal the mold with metal-to-metal contact. To form an effective encapsulation, a plastic is forced into the mold cavities containing the semiconductor unit and related parts. A plastic device 180 as shown in FIG. 8 is thereby fabricated. The plastic body is dense, and rugged, and the encapsulated parts are effectively sealed to protect the semiconductor unit 166 from contamination.

During the molding cycle a thin plastic flash may form in the openings between the portions of the leads, joining bands 150 and connecting portions 152. This flash is easily removed along with the lead spacer 154 by shearing along the dotted shear lines 181 shown in FIG. 8. The connecting portions 152 are removed by shearing along cut off planes 182 which are also shown in FIG. 8. The separated external lead portions may be bent down at a 90° angle from their original plane to aid in their insertion into a receptacle or socket to form the completed device 184, which is shown in actual size in FIg. 9.

The above described shearing and bending operations and the insertion of the external lead portions in receptacles subject the external portions of the leads to tensile, compressive and bending forces. It is important that these forces be attenuated as much as possible before they reach the internal portions of the leads, as has been described before, because they tend to destroy or substantially weaken the bonds at the ends of the interconnecting wires included within the encapsulated body. As shown in FIG. 4, and as previously described with respect to leads 76 and 78, the connecting portion of each lead includes a subportion, e.g., 120 and 137 which has a substantially reduced cross-sectional area with respect to the external portion of the lead. Each subportion, having a reduced cross-section tends to absorb bending forces applied to each lead by twisting or deforming rather than transmitting the forces to its associated longitudinal lead portions and eventually to the internal end of the associated lead, as may happen with the leads of FIG. 1 which have no intentionally weakened area. The force reduction is optimized by restricting the length of the lead portion which has a reduced cross-section. Furthermore, the previously described adjoining longitudinal and transverse portions of each lead are arranged to absorb compressive and tensile forces applied to the external portion of each lead in a manner similar to a spring.

Leads having the least amount of embedded surface area transverse to the direction of stress are most likely to be displaced by a mechanical force of a given magnitude. Lead 82 as shown in FIG. 4, and its counterpart have less surface area embedded in the plastic than the other leads. Lead 82 includes portions 190 and 192 which are transverse with respect to axis 93 and longitudinal portions 194 and 196 which are integrally formed generally in the shape of an S. Another lead portion 198 extends away from lead 82 into the encapsulating material to form an additional plastic lock. Shoulders 200 and 202 on the internal portion of lead 82 tend to prevent portion 190 from moving along axis 94 either in response to thermal expansion or in response to mechanical forces. Thus, the configuration of lead 82 reduces the transmission of mechanical forces from the external part of the lead to the internal end of the lead thereby protecting the wire bonds at each end of interconnecting wire 204.

What has been described, therefore, is an improved lead frame for use in the assembly of semiconductor devices. In the completed device, each lead has an improved configuration with an internal portion connected to a semiconductor die and a body portion enclosed by an encapsulating material which has a coefficient of thermal expansion which is different from the coefficient of thermal expansion of the material of the lead. The lead configuration reduces movement of the lead as the encapsulating material expands or contracts in response to changes in temperature to protect the connection. Moreover, the lead configuration reduces the transmission of mechanical forces from the external lead portions to the connection. This invention improves the percentage of acceptable devices provided during the manufacture of integrated circuits having multiple leads and corresponding bonds, and it increases the operating life of accepted devices.

We claim:

1. A metal frame member having a thermal expansion and contraction factor adapted for use in the manufacture of a plastic encapsulated semiconductor device wherein the plastic encapsulation has a thermal expansion and contraction factor different from that of the metal frame member, said frame member including a plurality of leads with each such lead having an end portion and a mounting portion for a semiconductor unit to be mounted thereon, each of such leads being adapted to be electrically connected by a fragile bonded connection at a lead end portion with such a semiconductor unit at corresponding contact pads on the semiconductor unit, each said lead having an improved configuration for attenuating the transmission of mechanical forces due to thermal contraction and expansion of the lead and due to thermal contraction and expansion of the plastic encapsulation so as to protect the fragile bonded connection between the lead and semiconductor unit at the contact pads against separation from one another, said improved configuration of said leads including at least two portions in each lead, each said portion being laterally displaced in the lead from the bonded connection at the end portion of such lead with the one of said portions lying in a longitudinal direction relative to the application of the mechanical force due to thermal contraction and expansion and a second portion extending from said first portion in a direction at right angles to said longitudinal direction, with said two portions together providing a first locking shoulder adapted to act to anchor the lead at such shoulder in plastic when it is ultimately embedded in the plastic encapsulation of a semiconductor device, and at least one of the leads in said plurality of leads having a configuration providing at least two pairs of portions with one pair spaced an incremental distance apart from the other pair over the length of said one lead, with each such pair of portions having one portion thereof at right angles relative to the other portion and providing a first pair locking shoulder thereby and a second pair of portions at right angles to one another providing a second pair locking shoulder thereby said first pair and second pair of locking shoulders on said one lead adapted to anchor that lead in plastic when embedded in plastic encapsulation, said anchoring acting to minimize relative movement between said encapsulation and a lead and thereby protect a fragile connection from separation at a semiconductor unit.

2. A metal frame member as defined in claim 1 wherein said improved configuration of a lead has at least two functions, one of which is the function of attenuating the movement of the parts of the metal frame member due to thermal expansion and contraction and accomplishing said one function by the said anchor interlock between a shoulder of the lead and plastic encapsulation for a semiconductor device, and a second function is that by which forces applied to a lead external of said plastic housing are relieved, said lead having a reduced cross section in the dimension thereof at a position adapted to be within the plastic encapsulation for a semiconductor device to accomplish the said second function.

3. A metal frame member as defined in claim 1 wherein the semiconductor device for which it is to be used utilizes fine wires for effecting the fragile bonded connections between contact pads on the semiconductor unit and corresponding leads, and said metal frame member is one of a plurality of corresponding frame members in a one-piece metal strip, said metal strip having a first portion and a second portion, each defining a respective outside longitudinal edge of the strip, a semiconductor unit mounting means connected between said first and second portions and positioned centrally between such portions for receiving a semiconductor unit thereon, with said improved configuration of the leads of each frame member adapted to minimize the possibility of disrupting the fragile bonded connections in a semiconductor device assembled with each frame member.

4. A metal frame member as defined in claim 1 wherein one other of said leads has at least three pairs of portions spaced apart an incremental distance from one another longitudinally on the lead away from the end of said lead adapted to have a bonded connection thereon extending to a semiconductor unit in an ultimate device, each pair of lead portions being at right angles to one another and providing a locking shoulder at each pair, with the lead configuration provided by said pairs of portions acting to minimize relative movement between said lead and a plastic body encapsulation for a device utilizing said metal frame member.

5. A metal frame member as defined in claim 1 wherein each lead in said frame member includes an end portion at the end thereof which would be within the plastic body encapsulation having a reduced cross-section for accommodating forces applied to the lead outside a device to minimize any harmful effect of said externally applied forces.

6. In a semiconductor device with a plastic body encapsulation therefor having a semiconductor unit with contact pads thereon housed in said plastic body, a plurality of metal leads each having a portion embedded in said plastic body and another portion outside said body, electrical connectors embedded in said plastic body and each of which has a connection at one end to a contact pad on the semiconductor unit and has said connection at the other end to an end portion of a metal lead, with said connections comprising generally fragile connections, said plastic body having one coefficient of thermal expansion and contraction and the material for the metal leads having a different coefficient of thermal expansion and contraction, and means in said metal leads acting upon an increase in the temperature of said device for attenuating the relative movement between such plastic body and a metal lead due to said different coefficients and minimizing the possibility of the separation of an electrical connector at a said connection, said means including an improved configuration for the portion of at least one metal lead embedded in the plastic body comprising two lead portions with one lead portion at right angles to the second lead portion and together providing a first locking shoulder, and said means including an improved configuration for the portion of at least a second metal lead of said plurality of metal leads embedded in the plastic body, said second metal lead comprising a plurality of pairs of lead portions with said pairs spaced apart from one another incrementally over the length of said second metal lead, with one said lead portion of each pair of lead portions in said second metal lead being at right angles to the other lead portion of a pair and providing a locking shoulder, with the locking shoulders provided by the plurality of pairs of lead portions in the second metal lead embedded in the plastic body, and with the locking shoulders of said one metal lead and of said second metal lead respectively cooperating with the plastic body to anchor said one and said second metal leads therein in a manner to minimize relative movement between the plastic body encapsulation and said respective metal leads to protect the fragile connections corresponding to said one and said second metal leads from separation upon an increase in the temperature of the device and the thermal expansion of the plastic body due to such increase.

7. A semiconductor device as defined in claim 6 wherein said one metal lead and said second metal lead each have an enlarged portion outwardly from the most outwardly positioned locking shoulder of each, and said enlarged portion of each said metal lead having therein a pair of oppositely positioned slots which reduce the cross-section of each said metal lead at said slots for the purpose of minimizing the effect of mechanical forces applied to the external portion of each said metal lead with respect to the generally fragile connections at the internal end of each said metal lead.

* * * * *